United States Patent [19]
Wong

[11] Patent Number: 5,872,732
[45] Date of Patent: Feb. 16, 1999

[54] NONVOLATILE MEMORY

[75] Inventor: Ting-wah Wong, Cupertino, Calif.

[73] Assignee: Programmable Silicon Solutions, Sunnyvale, Calif.

[21] Appl. No.: 96,158

[22] Filed: Jun. 11, 1998

Related U.S. Application Data

[62] Division of Ser. No. 840,303, Apr. 11, 1997.

[51] Int. Cl.$^6$ ..................................... G11C 16/04
[52] U.S. Cl. .................. 365/185.18; 365/185.27; 365/185.28; 365/225.6
[58] Field of Search ................ 365/185.01, 185.1, 365/225.6, 185.27, 185.18, 185.28

[56] References Cited

U.S. PATENT DOCUMENTS

| | | | |
|---|---|---|---|
| 5,301,150 | 4/1994 | Sullivan et al. | |
| 5,371,703 | 12/1994 | Miyamoto | 365/225.6 X |
| 5,457,652 | 10/1995 | Brahmbhatt | 257/315 |
| 5,504,706 | 4/1996 | D'Arrigo et al. | |
| 5,617,352 | 4/1997 | Shoemaker | 365/185.1 |
| 5,629,891 | 5/1997 | LeMoncheck et al. | 365/185.27 |
| 5,761,121 | 6/1998 | Chang | 365/185.14 |

FOREIGN PATENT DOCUMENTS

| | | |
|---|---|---|
| 0 493 640 A1 | 7/1992 | European Pat. Off. |
| 0 776 049 A1 | 5/1997 | European Pat. Off. |
| 285777 | 9/1996 | Taiwan . |
| WO 94/00881 | 1/1994 | WIPO . |

*Primary Examiner*—Huan Hoang
*Attorney, Agent, or Firm*—Trop, Pruner, Hu & Miles, P.C.

[57] ABSTRACT

A nonvolatile memory cell is formed in an embedded P-well without the necessity of including an overlaying control gate. As a result, normal logic process technology may be utilized to form the nonvolatile memory cell. Through the use of substrate hot electron injection and the formation of a lateral bipolar transistor whose emitter acts as a charge injector, programming efficiency is improved and the necessary programming voltages and currents can be reduced from the relatively high voltages and currents used in other devices.

8 Claims, 5 Drawing Sheets

NONVOLATILE MEMORY

This is a divisional of prior application Ser. No. 08/840,303 filed Apr. 11, 1997.

BACKGROUND OF THE INVENTION

This invention relates generally to nonvolatile memories and particularly to electrically erasable nonvolatile memories.

Nonvolatile memory cells are advantageous since they retain recorded information even when the power to the memory is turned off. There are several different types of nonvolatile memories including erasable programmable read only memories (EPROMs), electrically erasable and programmable read only memories (EEPROMs) and flash EEPROM memories. EPROMs are erasable through light exposure but are electrically programmable by channel electron injection onto a floating gate. Conventional EEPROMs have the same programming functionality, but instead of being light erasable they can be erased and programmed by electron tunneling. Thus, information may be stored in these memories, retained when the power is off, and the memories may be erased for reprogramming, as necessary, using appropriate techniques. Flash EEPROMs are block erased, typically giving them better read access times than regular EEPROMs.

Currently, flash memories have gained considerable popularity. For example, flash memories are often utilized to provide on-chip memory for microcontrollers, modems and SMART cards and the like where it is desirable to store codes that may need fast updating.

While flash memories and EEPROMs are closely related, in many instances flash memories are preferred because their smaller cell size means that they can be made more economically. However, flash memories and EEPROMs often have very similar cell attributes.

Nonvolatile memory cells differ in certain respects from the transistors that are generally utilized in electronic components called logic devices, such as microcontrollers, that work with the memory cells. Logic devices are formed of transistors that use a single gate electrode. Nonvolatile memories usually include two gate electrodes, known as the control and floating gate electrodes, situated one over the other. Because of this structural difference, nonvolatile memories and logic devices may be made by different processes. This may contribute to a substantial increase in process complexity and manufacturing cost.

Particularly with an EEPROM, the electrical programming of the cells normally requires substantial potentials to be applied to the cells. These potentials induce electron tunneling from an N+ region onto the floating gate. Additional complexity may arise from the need to provide substantially larger voltages to memory cells than are needed for normal transistor operation.

While the industry has come to accept the need for separate process technologies for logic and nonvolatile memories and while those in the industry have also come to appreciate that significant voltages are needed to program EEPROMs and significant currents to program flash EEPROMs, there would be a substantial demand for a nonvolatile memory which was both electrically erasable and programmable without the need for special process technologies or for relatively higher programming voltages and higher currents.

Furthermore, with the conventional FLASH EEPROMs, the electrical programming of the cells normally requires high current to be applied to the cells. A relatively minute amount of this electron current becomes injected from the drain depletion region onto the floating gate. Therefore, the injection efficiency (e.g., $10^{-6}$ to $10^{-9}$) is relatively low. The requirement of high current adds additional complexity because of the design of the high current pump operated at low voltage.

SUMMARY OF THE INVENTION

In accordance with one aspect of the present invention, an electrically erasable and programmable read-only memory includes a sensing cell with a floating gate electrode, a channel, a source and a drain. A bipolar transistor is adapted to supply electrons for programming the floating gate electrode by substrate hot electron injection of electrons on to the floating gate electrode through the channel depletion region. The bipolar transistor is arranged such that its collector is also the biased depletion region of the channel of the sensing cell.

In accordance with still another aspect, a nonvolatile memory includes a semiconductor layer of a first conductivity type. A first well of a second conductivity type opposite to the first conductivity type is formed in the semiconductor layer. The first well is an N-well biased to a potential equal to or more positive than Vss. A second well of the first conductivity type is embedded in the first well. The second well is a negatively biased P-well. A memory cell is formed in the second well. The cell includes a floating gate, a source and a drain. The source and drain are of the second conductivity type.

In accordance with yet another aspect of the present invention, a memory cell includes a semiconductor layer having a N-well. A P-well is embedded in the N-well. The sense transistor has a floating gate and a bipolar transistor arranged to inject electrons into the substrate. The injected (pump) electrons can be accelerated by the electric field under the sense transistor channel and get injected onto the floating gate.

In accordance with yet another aspect of the present invention, a method for programming a memory cell includes the step of turning off a select transistor. Carriers are caused to be injected onto the floating gate by substrate hot carrier injection.

In accordance with still another aspect of the present invention, a method for programming a memory cell includes the step of generating substrate electrons using a bipolar transistor. Substrate electrons are accelerated by the electric field under the channel and are injected onto the floating gate of the memory cell. These accelerated electrons are called substrate "hot" electrons.

In accordance with but another aspect of the present invention, a method for forming a memory cell includes the step of forming a floating gate over a channel in a substrate. A diffusion is formed in the substrate spaced from the channel underneath the floating gate and extending under the floating gate. A source and drain are formed for the cell, arranged substantially transversely to the length of the floating gate.

In accordance with another aspect of the present invention, a nonvolatile memory comprises a sense transistor having a floating gate. A coupling capacitor is formed at one end of the floating gate. The coupling capacitor is arranged to control the potential on the floating gate. The floating gate is free of an overlaying control gate electrode. A tunneling capacitor is formed at another end of the floating gate. The tunneling capacitor provides a path for electrons to be removed from the floating gate. It also acts as part of a charge injector for supplying electrons to the channel region under the sense transistor. The tunneling capacitor includes a junction forming the emitter of a lateral bipolar transistor, the biased depletion region of the sense transistor channel under said floating gate acting as the collector of the lateral bipolar transistor.

DESCRIPTION OF THE PREFERRED EMBODIMENT

Figure 1:
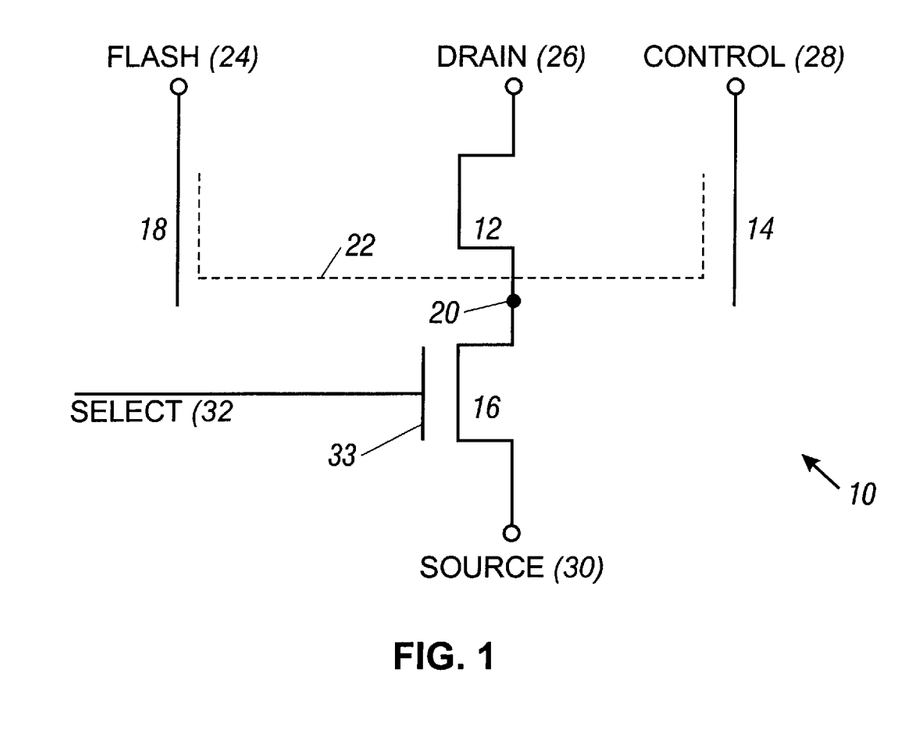
FIG. 1 is a schematic depiction of one embodiment.

Referring to the drawing wherein like reference characters are used for like parts throughout the several views, a memory cell 10, shown in FIG. 1, includes a tunneling capacitor 18, a sense transistor 12, a select transistor 16, and a coupling capacitor 14. This structure is advantageously implemented on a semiconductor layer having situated thereon an electrically isolated floating gate 22.

The tunneling capacitor 18 is controlled by the flash node 24, and the coupling capacitor 14 is controlled by the control node 28. The drain 29 of the sense transistor 12 is connected to the drain node 26 and the source 31 of select transistor 16 is connected to the source node 30. The gate 33 of the select transistor 16 is connected to the select node 32.

Figure 2:
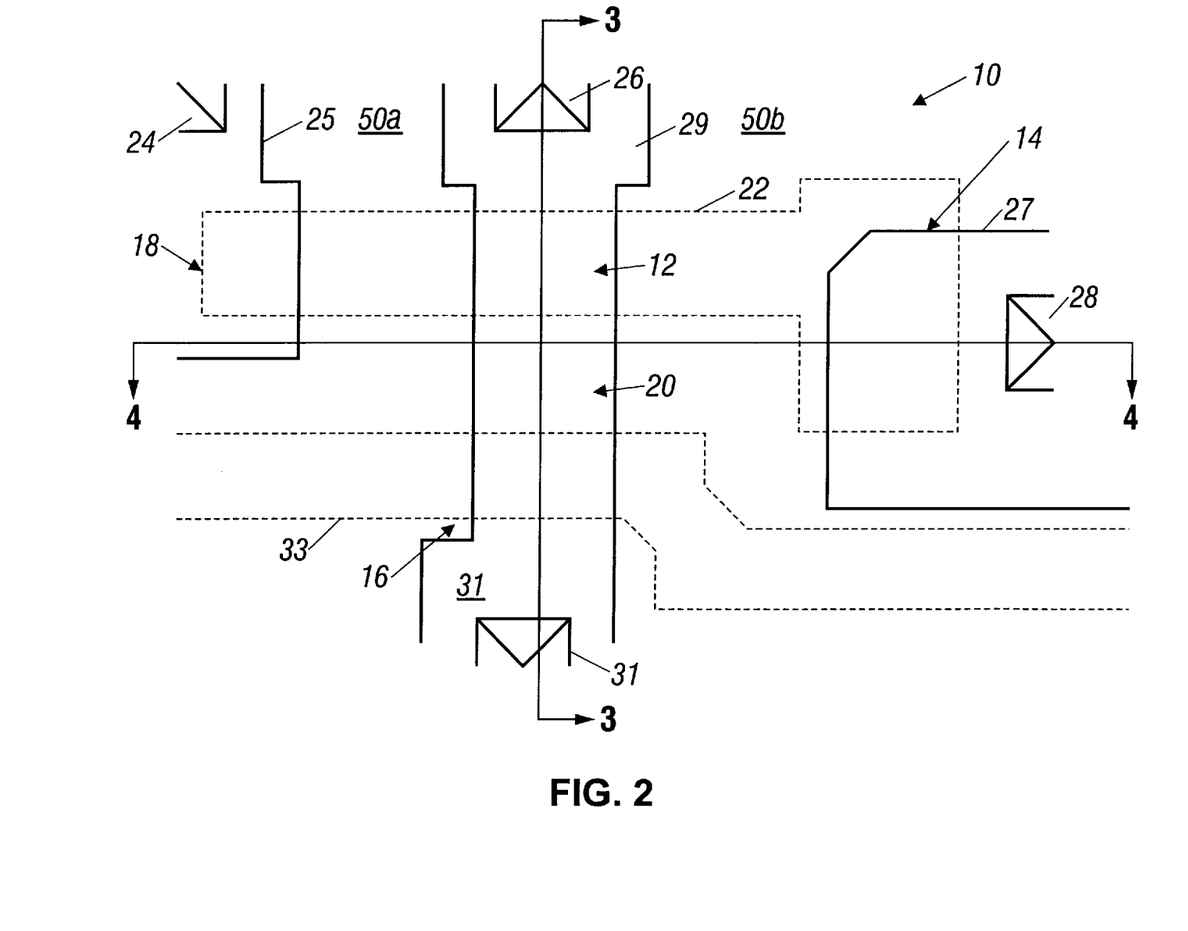
FIG. 2 is a top plan view showing the layout of a semiconductor implementation of the embodiment shown in FIG. 1.

One layout for implementing the cell 10, shown in FIG. 2, includes the flash node 24 which is implemented as a contact and a diffusion 25 which is typically an N-type diffusion. The floating gate 22 extends over the diffusion 25 to define the tunneling capacitor 18. Similarly, the floating gate 22 extends over the diffusion 27 to define the coupling capacitor 14. The control node 28 for the coupling capacitor 14 may be implemented by a contact, as shown in FIG. 2.

The drain node 26 may include a contact as illustrated in FIG. 2 which connects to a diffusion 29. The source node 30 may be implemented by a contact as illustrated. The source of the sense transistor 12 and the drain of the select transistor 16 are common as indicated at 20 in FIG. 2. The gate electrode of the select transistor 16 is formed as the conductive layer 33 which connects to a contact (not shown). A single pair of a source 30 and drain 26 contacts are operative to form two transistors with separate gates 22 and 33.

Figure 3:
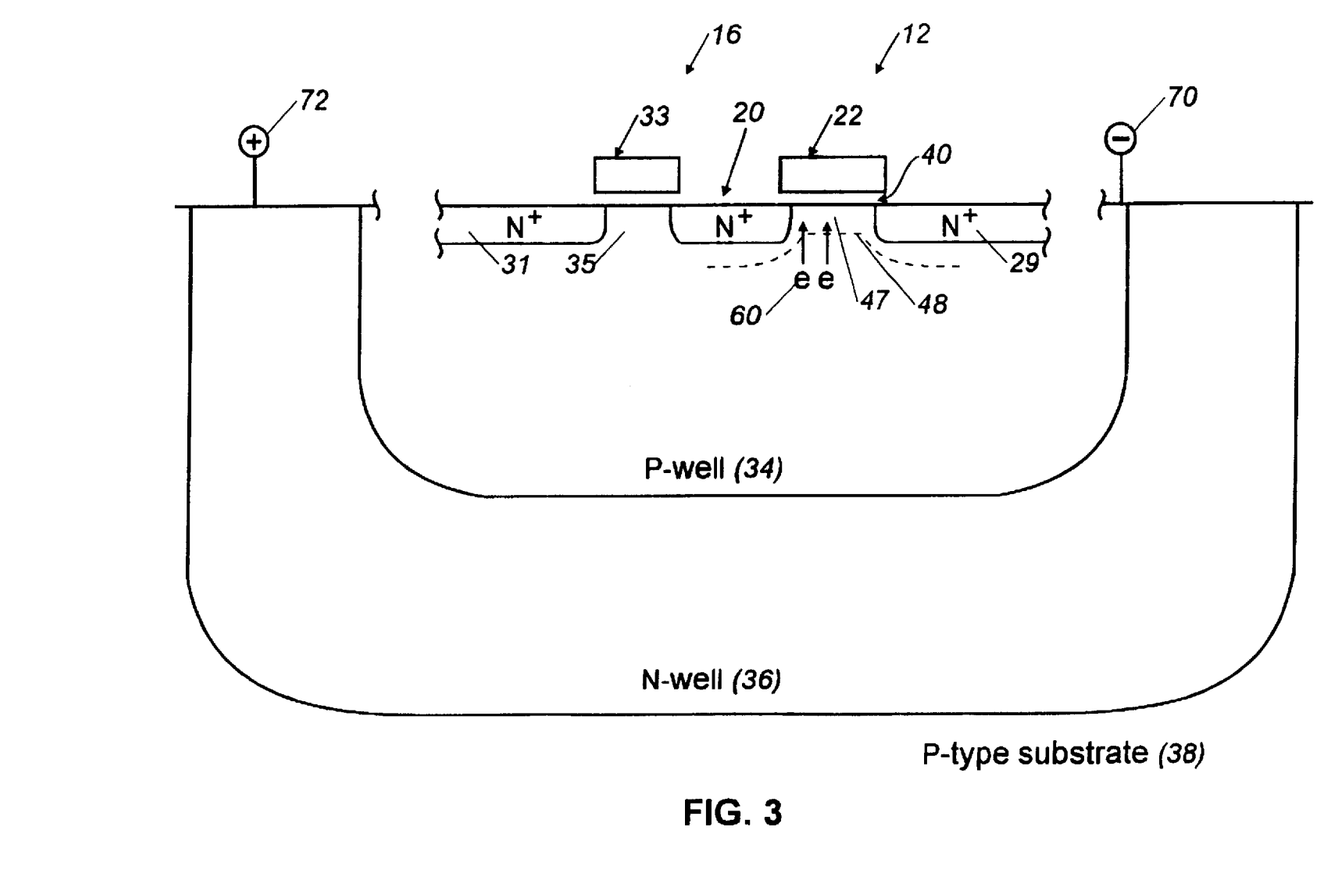
FIG. 3 is a cross-sectional view taken generally along the line 3—3 in FIG. 2.

The relationship of the sense transistor 12 and select transistor 16 is illustrated in FIG. 3. The floating gate 22 forms the gate of a transistor having a drain 29 and a common junction 20. Similarly, the gate 33 acts to control conduction between the source 31 and the common junction 20. The sense transistor 12 includes a channel 47 while the select transistor 16 includes a channel 35. In the illustrated embodiment, the channels 47 and 35 are P-type semiconductor material and are part of a P-well 34. The P-well 34 in turn is formed in an N-well 36. Finally, the N-well 36 is formed in a P-type substrate 38. The P-well may be negatively biased, as indicated at 70, and the N-well 36 may be positively biased, as indicated at 72. The N-well 36 may be biased to a potential equal to or more positive than Vss.

Figure 4:
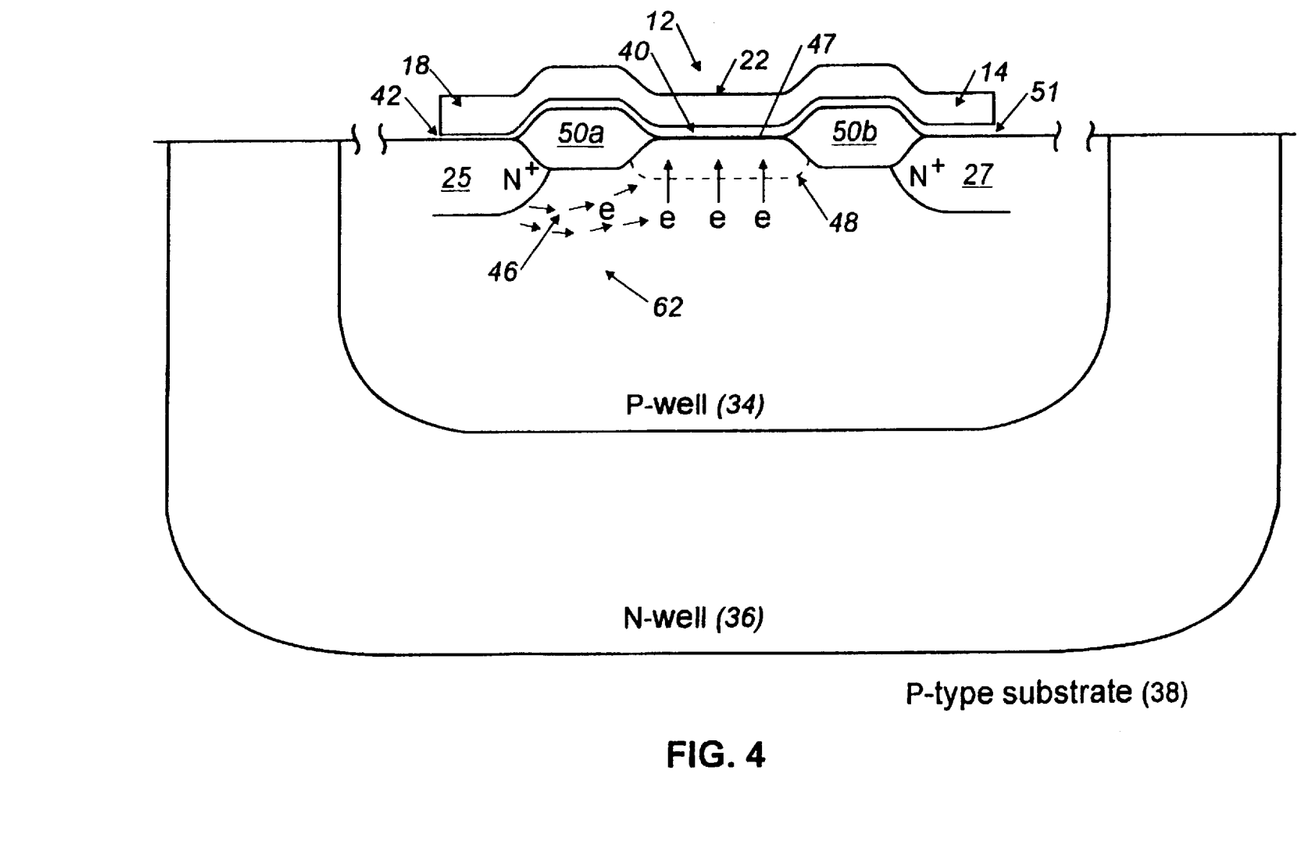
FIG. 4 is a cross-sectional view taken generally along the line 4—4 in FIG. 2.

Referring now to FIG. 4, the configuration of the floating gate 22 in connection with the tunneling capacitor 18 and coupling capacitor 14 can be explained. The floating gate 22 extends over a pair of field oxide regions 50 which extend generally parallel to the source-to-drain direction of the sense transistor 12 and select transistor 16. At one end in FIG. 4, the floating gate 22 forms the tunneling capacitor 18 by its interaction with the underlying region 25 which may be an N+ diffusion. A tunneling oxide 42 separates the floating gate 22 from the diffusion 25. Similarly the gate oxide 40 separates the floating gate 22 from the channel 47. Finally, the floating gate 22 is separated by the oxide 51 from the diffusion 27 of the coupling capacitor 14. Thus, the floating gate 22 is part of the sense transistor 12 and the capacitors 14 and 18.

The cell 10 may be described as a flash EEPROM utilizing high efficiency substrate hot electron injection for programming and Fowler-Nordheim tunneling for erasure. The process of substrate hot electron injection is well described in T. H. Ning, C. M. Osburn, and H. W. Yu "Emission Probability of Hot Electrons from Silicon into Silicon Dioxide", J. Appl. Phys., vol. 48, p. 286, (1977); Boaz Eitan, James L. McCreary, Daniel Amrany, Joseph Shappir, "Substrate Hot-electron Injection EPROM", IEEE Transactions on Electron Devices, Vol. ED-31, No. 7, p. 934, (July 1984); I. C. Chen, C. Kaya, and J. Paterson, "Band-to-Band Tunneling Induced Substrate Hot-electron (BBISHE) injection: A New Programming Mechanism for Nonvolatile Memory Devices", IEDM (1989) p. 263; and C. Y. Hu, D. L. Kencke, S. K. Benerjee, "Substrate-current-induced Hot Electron (SCIHE) Injection: A New Convergence Scheme for FLASH Memory," IEDM (1995), p. 283. Each of these articles is hereby expressly incorporated by reference herein.

Programming is achieved by high efficiency substrate hot electron injection. As indicated in FIG. 4, substrate electrons 60 (FIG. 3) are generated by forward biasing the diffusion 25 which is separated from the sense transistor 12 by the field oxide 50a. Some of the substrate electrons 60 diffuse through the region underneath the field oxide 50a to the channel region 47 underneath the sense transistor 12. For cells that need to be programmed, the channel region 47 is biased such that a depletion region 48 is formed. When an electron gets to the depletion region 48, it is accelerated by an electric field, Vcs, which is the difference between the channel 47 potential (potential of the surface inversion region) and the P-well 34 potential. Some of these electrons gain sufficient energy, in excess of the effective oxide barrier height potential, to be injected onto the floating gate 22. For cells that are not to be programmed, the channel-to-P-well potential is less than the effective oxide barrier height. In such case, the electrons would not gain sufficient energy to overcome the barrier height and are not injected onto the floating gate 22.

The diffusion 25, the P-region under the field oxide 50a and the biased depletion region 48 under the sense transistor 12 form a lateral bipolar transistor 62. The bipolar transistor 62 acts as a charge injector, injecting substrate electrons from the diffusion 25 onto the floating gate 22. With the diffusion 25 as the emitter, the P-region under the field oxide 50a as the base, the collector is the depletion region 48. The depletion region 48 is controlled by the N+ source 20 and N+ drain 29, and the P-well 34 potential. Since the channel region 47 acts as the channel for reading the sense transistor 12 and as the collector of the bipolar transistor 62 during programming, a compact cell layout is achieved.

The efficiency of substrate hot electron injection is a function of a number of characteristics. Considering the depletion region 48, electrons scatter with lattice phonon scattering across the depletion region 48 with a certain electron mean free path. Some of these electrons, without much scattering, gain sufficient energy to overcome the effective barrier height and are injected onto the floating gate 22. Some electrons gain less energy than the effective barrier height and are not injected onto the floating gate 22. The injection efficiency is a strong function of the doping concentrations and the channel-to-P-well potential, Vcs.

Since the cell 10 is situated in a P-well 34 embedded in an N-well 36, during programming the floating gate 22 is capacitively coupled to a higher voltage through the coupling capacitor 14 by raising the diffusion 27 to Vpp, which may be from 7 to 14 volts. The voltage that the floating gate 22 attains is a function of the voltage on the floating gate when both the nodes 24 and 28 are at ground, plus the coupling ratio times the voltage on the node 28. The coupling ratio to first order is approximately equal to the capacitance of the capacitor 14 divided by the sum of the capacitances of the coupling capacitor 14, the tunneling capacitor 18 and the capacitance between the floating gate 22 and the channel region 47.

When the select transistor 16 is off, the sense transistor drain 29 potential can be forced close to the supply potential Vcc or higher. Since the select transistor 16 is off, the source 20 potential follows the channel 47 potential. The channel 47 potential is the potential of the surface inversion region of the channel region. When the potential of the floating gate 22 is one sense transistor 12 threshold voltage higher than the drain 29 potential, the channel potential is the same as the drain potential. On the other hand, when the floating gate 22 potential is less than the drain 29 potential plus the sense transistor 12 threshold voltage, the channel potential is the difference between the floating gate 22 voltage and the sense transistor 12 threshold voltage.

The well potential is the voltage 70 applied to the P-well 34. Since the P-well is embedded in an N-well 36, and the N-well is set at a voltage 72 approximately Vss or higher, the P-well potential Vp can be biased negatively, typically negative one to negative two volts. Moreover, it is usually less than the effective oxide barrier height to avoid any potential disturb problem.

The potential difference between the channel 47 region and the P-well 34 potential (Vp) 70 is the voltage across the depletion region 48. For cells to be programmed, the drain 29 voltage is raised high, typically close to Vcc. A depletion region 48 in the channel 47 underneath the sense transistor 12 is formed with a voltage drop equal to the channel potential minus the P-well potential 70.

For those cells that are not to be programmed, the drain voltage 29 is set to zero volts. The voltage drop across the depletion region 48 then is equal to the absolute value of Vp, which is typically less than the effective oxide barrier height.

Cell 10 erasure is achieved by Fowler-Nordheim tunneling from the floating gate 22 to the node 24. The node 24 is therefore called the flash node. During erasure, the floating gate 22 is capacitively coupled through the capacitor 14 to a potential close to ground by forcing the diffusion 27 to ground. As for the diffusion 25, it is charged to a positive potential (Vpp) of from 7 to 14 volts. The voltage across the capacitor 18 is the difference between the floating gate 22 potential and the diffusion 25 potential. When the difference exceeds 8 to 10 volts, sufficient tunneling current is generated and the floating gate 22 can be erased to a negative potential in the time frame of a few milliseconds to a few seconds, depending on the tunneling oxide 42 thickness.

Reading the programming state of the cell 10 may be accomplished as follows. For the selected row the floating gate 22 is capacitively coupled to a higher potential by forcing the diffusion 27 to a potential of 1.8 to 5 volts. The floating gate 22 is coupled to a potential Vfg which can be calculated as being equal to the sum of the floating gate potential when both nodes 24 and 28 are held at ground, plus the potential on the control node 28 times the coupling ratio.

The drain 29 potential during reading is limited to a voltage of less than 2 volts. This is to avoid any read disturb.

For the selected cell to be read, the select node 32 is forced to Vcc, and the source node 30 is forced to ground. The unselected gates 33 and the nodes 28, 30 and 32 are also forced to ground. The unselected column 26 is also forced to ground.

When these potentials are applied to the selected cell, a current flows through the sense transistor 12. This current is then fed to a current sense amplifier (not shown). If the voltage on the floating gate 22 is greater than the threshold voltage on the sense transistor 12, and a higher current, perhaps greater than 20 microamps flows, the cell state is detected as the conducting state. When the potential of the floating gate is less than the threshold voltage, a lower current, for example or less than one microamp flows, and a nonconducting state is detected.

A detected conducting state can be called a one state. A nonconducting state can be called the zero state.

The operation of the cell in programming, reading and erasing, for an exemplary embodiment, is summarized in the following example:

| | Cell Operation | | | | | |
|---|---|---|---|---|---|---|
| | Erase | | Program | | Read | |
| | (Selected) | (Unselected) | (Select) | (Unselected) | (Select) | (Unselected) |
| RASH (24) | Vpp | Vss | Vs | Vs or vss | Vss | Vss |
| Drain (26) | Float | Float | ≧Vcc | *0 or ≧Vcc | ~1.5 V | *0 or ~1.5 V |
| Source (30) | Float | Float | Float | Roat | Vss | Vss |
| Select (32) | Vss | Vss | Vss | Vss | Vcc | Vss |
| Control (28) | Vss | Vss | Vpp | Vss | 2–5 V | Vss |
| N-well (36) | Vcc | Vcc | Vcc to Vss | Vcc to Vss | Vcc | Vcc |
| P-well (34) | Vss | Vss | Vss to –2 | Vss to –2 | Vss | Vss |

*0 is for an unselected column.

Vs is the node voltage set by the injection current level, ranging from a few nanoamps to a few tens of microamps depending on the programming speed requirement. Typically it would be from tens of milliseconds to tens of microseconds. Vbias is the bias on the P-well 34 which can be Vss or it can be forced to −1 to −2 volts to enhance injection efficiency. A suitable on-chip circuit for generating two negative bias potentials, one to bias the diffusion 31 and the other to negatively bias the P-well 34, can be found in L. A. Glasser and D. W. Dobberpuhl, "The Design and Analysis of VLSI Circuits", (December 1985), published by Addison-Wesley, at pages 301–329, hereby expressly incorporated by reference herein. Vss is the external ground potential.

Figure 5:
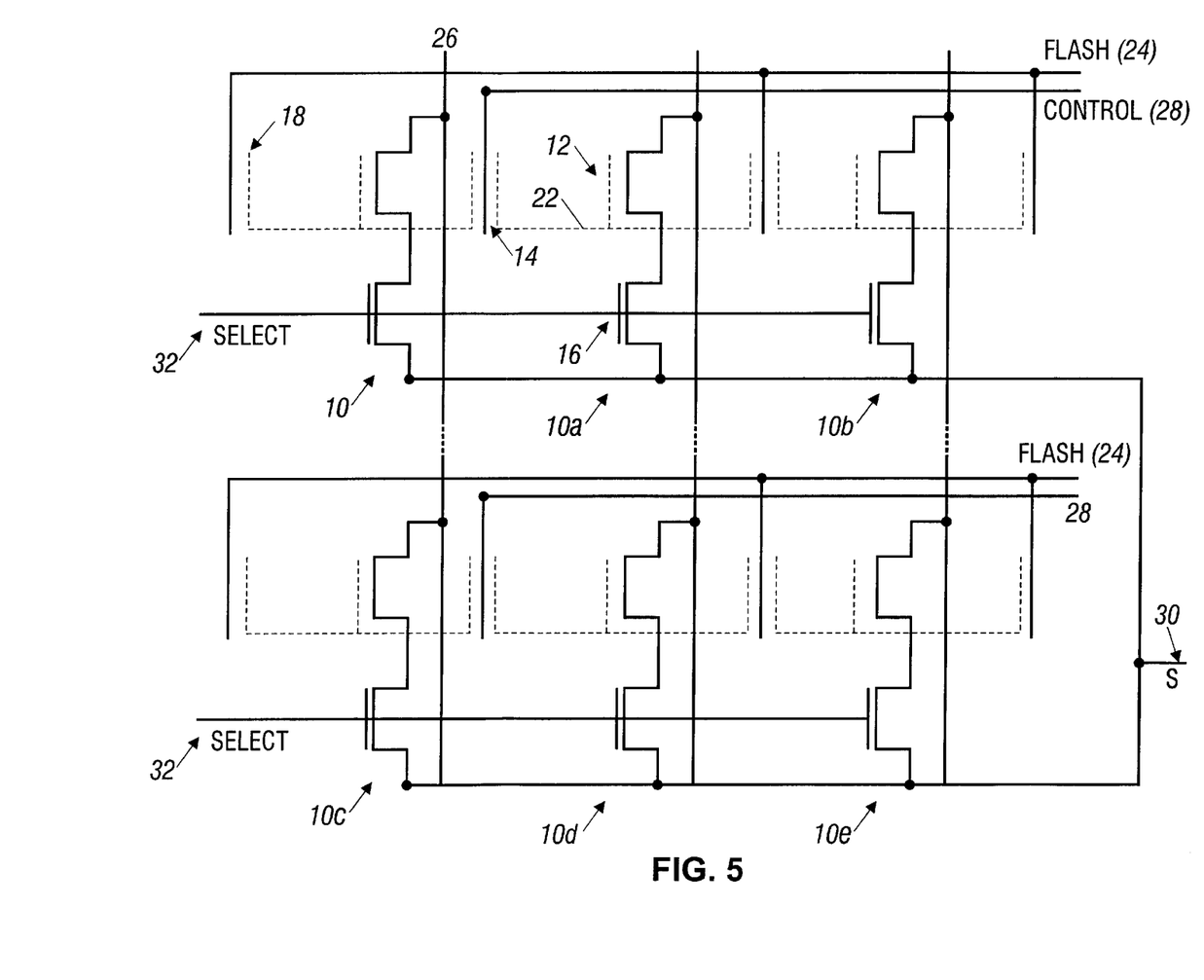
FIG. 5 is a schematic depiction of an array configuration for the cell shown in FIG. 1.

While the cell 10 may be utilized as a single element as shown in FIG. 1, it can also be connected as an array as shown in FIG. 5. In the array, a plurality of cells 10, 10a, 10b, 10c, 10d and, 10e are depicted. The flash node 24 is formed by connecting all of the flash nodes of cells in the same row as one single node. This enables all cells on the same row to be erased and programmed at the same time.

The control node 28 is formed by connecting all the control nodes of the individual cells in the same row together as a single node. This enables the floating gate 22 for all cells on the same row to rise to a relatively high potential (Vpp) during programming, such as 7–14 volts, at the same time and close to Vcc during read. All cells on the same row (which can be byte wide or page wide) can then be programmed together.

The source node 36 is formed by connecting the source lines for all the cells on the same row together. Similarly, the select gate node 32 can be formed by connecting together all the cells of the same row as a single node.

The drain node 26 is formed by connecting all the drain nodes for cells in the same column together as a single node. This node leads to the sense amplifier (not shown).

The cells in the array maybe formed using conventional process technologies such as a single poly, double metal process. Because there is no control gate electrode, a process technology that is completely compatible with normal logic process technology may be utilized.

The illustrative parameters set forth herein contemplate a 0.35 μm or higher feature size with Vcc potentials of 2.7 volts or higher. As the technology permits lowering voltages and smaller feature sizes, the parameters herein would scale accordingly.

The starting substrate material is typically P-type (100) silicon, for example having a resistivity range of 10–25 ohm-cm. The P-well 34 is embedded in an N-well 36 in the so-called triple well process. The P-well 34 has a typical well depth of, for example, 2 to 4 um with an average doping concentration, for example, in the range of $1 \times 10^{16}$ to $5 \times 10^{16}$ atoms per cubic centimeter.

The N-well has a typical well depth of, for example, 4–8 um. The doping concentration may be from $4 \times 10^{15}$ to $1 \times 10^{16}$ atoms per cubic centimeter. The triple well is formed by the P-well 34 counterdoping the N-well 36.

The formation of the elements in the triple well is as follows. An N-well implant is done, for example, with phosphorous ($P_{31}$) with a typical dose of 1.0 to $1.5 \times 10^{13}$ atoms per square centimeter and energies from 160 Kev to about 100 Kev. The N-well implant is driven using a high temperature step which may typically be 6 to 12 hours at 1125° to 1150° C. The N-well 36 is then counterdoped with a P-well implant. Typical dosages for the P-well implant could be 1.5 to $2.5 \times 10^{13}$ atoms per square centimeter with energies of 30 Kev to 180 Kev using a species such as boron (B11).

The N-well 36 and P-well 34 are then driven, typically 6 to 10 hours at 1125° to 1150° C. This sets the wells to the desired doping concentrations and depths.

After well formation, standard logic field oxide formation and channel stop formation steps are applied. The field oxide 50 and implant doses are adjusted to achieve a field threshold of 7 to 14 volts, which is determined by the Vpp level for programming and erasing and by logic process capability. After field oxide and channel stop formation, the N+ diffusions 25 and 27 are formed using an ion implant, such as a phosphorus implant, with an energy of 30–60 Kev and a dose of $1.2 \times 10^{14}$ to $2.5 \times 10^{14}$ atoms per square centimeter. This may be followed by an anneal cycle of 925° to 1000° C. for 15 to 35 minutes.

After the formation of the N+ diffusions 25 and 27, the gate oxide 40 and the tunnel oxide 42 are formed. For example, a 70 to 90A dry oxide may be grown across the wafer followed by a resist masking step. The resist may cover everything except the tunnel oxide 42 region and the periphery N channel and P channel regions. The N and P channel threshold adjustment implants are then done into all the areas that are not covered by resist. A buffered oxide etch (BOE) is used to etch off the oxide in the region that is not covered by resist. After resist removal, a dry oxide is grown to a thickness 85 to 100 Angstroms, for example, at 900° C. in partial oxygen followed by a 975° to 1050° C. anneal. This forms a gate oxide 40 with a typical thickness of 120 to 150 Angstroms and a tunnel oxide 42 of 85 to 100 Angstroms.

The floating gate 22 may then be formed of polysilicon, silicide or metals after the oxide 40 has been grown. Standard gate patterning is used and source/drain implant steps follow the gate patterning. This sequence forms two capacitors and two transistors. The tunnel oxide 42 is sandwiched between two electrodes, the N+ diffusion 25 and the floating gate 22. This forms the tunneling capacitor 18. The gate oxide 40 sandwiched between the floating gate 22 and the N+ diffusion 27 forms the coupling capacitor 14. The gate oxide 40 that is sandwiched between the floating gate and the channel region 47 forms the sense transistor 12. The select transistor 16 is formed by the gate oxide 40 and the select gate 33.

With the completion of these capacitor and transistor structures, all subsequent processing for contacts and interconnect layers follows standard logic rear end processing.

While a number of parameters and levels were provided in the foregoing description, those skilled in the art will appreciate that these parameters and levels are merely for illustration purposes. For example, by reversing the conductivity types of the doped junctions and the bias polarities, a cell structure using substrate hot hole injection may be implemented. It is intended that the appended claims cover all modifications and variations as fall within the true spirit and scope of the present invention.

What is claimed is:

1. A method for programming a memory cell having a channel and a floating gate forming a capacitor with an underlying diffusion, comprising:

generating substrate electrons with a bipolar transistor;

injecting said electrons onto the floating gate of said memory cell using substrate hot electron injection through said channel; and controlling said floating gate using said capacitor without using an overlying control gate.

2. The method of claim 1 wherein said cell is formed in a P-well embedded in an N-well, said method including the step of biasing said P-well negatively.

3. The method of claim 1 including the step of turning off a select transistor.

4. The method of claim 1 including the step of forward biasing the emitter of a bipolar transistor used to provide a source of electrons for substrate hot electron injection.

5. A method for programming a memory cell having a channel, said cell being formed in a p-well embedded in a n-well, comprising:

generating substrate electrons with a bipolar transistor;

injecting said electrons onto the floating gate of said memory cell using substrate hot electron injection through said channel; and biasing said p-well negatively.

6. The method of claim 5 including turning off a select transistor.

7. The method of claim 5 including controlling the operation of said floating without using an overlying control gate.

8. The method of claim 7 wherein said floating gate forms a capacitor with an underlying diffusion, said method including the step of controlling said floating gate using said capacitor.

\* \* \* \* \*